(12) United States Patent
Kawaguchi

(10) Patent No.: US 8,987,814 B2
(45) Date of Patent: Mar. 24, 2015

(54) SEMICONDUCTOR DEVICE

(71) Applicant: Kabushiki Kaisha Toshiba, Minato-ku (JP)

(72) Inventor: Yusuke Kawaguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/043,192

(22) Filed: Oct. 1, 2013

(65) Prior Publication Data
US 2014/0319603 A1 Oct. 30, 2014

(30) Foreign Application Priority Data
Apr. 26, 2013 (JP) .................................. 2013-094678

(51) Int. Cl.
*H01L 29/78* (2006.01)

(52) U.S. Cl.
CPC .................................. *H01L 29/7827* (2013.01)
USPC .................................. 257/331; 257/E29.268

(58) Field of Classification Search
USPC .................................. 257/331, 339
See application file for complete search history.

(56) References Cited

U.S. PATENT DOCUMENTS

| | | | |
|---|---|---|---|
| 6,507,088 B2 | 1/2003 | Yoneda | |
| 7,880,227 B2 * | 2/2011 | Takahashi | 257/330 |
| 8,304,829 B2 * | 11/2012 | Yedinak et al. | 257/334 |

FOREIGN PATENT DOCUMENTS

| | | |
|---|---|---|
| JP | 2008-294240 A | 12/2008 |
| JP | 2010-010263 A | 1/2010 |
| JP | 2012-238898 A | 12/2012 |

* cited by examiner

*Primary Examiner* — Chandra Chaudhari
(74) *Attorney, Agent, or Firm* — White & Case LLP

(57) ABSTRACT

According to one embodiment, a semiconductor device includes a first semiconductor layer of a first conductivity type; a first electrode electrically connected to the first semiconductor layer; a second semiconductor layer of a second conductivity type provided on the first semiconductor layer; a third semiconductor layer of the first conductivity type selectively provided on the second semiconductor layer; a second electrode electrically connected to the second semiconductor layer and the third semiconductor layer; a third electrode and a floating electrode provided from an upper surface side of the third semiconductor layer through the third semiconductor layer and the second semiconductor layer to the first semiconductor layer via a first insulating film; a second insulating film provided between the second electrode and the third electrode, the second electrode and the floating electrode.

4 Claims, 4 Drawing Sheets

SEMICONDUCTOR DEVICE

CROSS-REFERENCE TO RELATED APPLICATIONS

This application is based upon and claims the benefit of priority from the prior Japanese Patent Applications No. 2013-094678, filed on Apr. 26, 2013; the entire contents of which are incorporated herein by reference.

FIELD

Embodiments described herein relate generally to a semiconductor device.

BACKGROUND

MOSFETs (Metal Oxide Semiconductor Field Effect Transistors) are used for switching power supplies operating at high current and high breakdown voltage. Furthermore, the demand for the MOSFETs has been rapidly increasing in the market for energy-saving switching power supplies used in, for example, mobile communication devices such as notebook personal computers. The MOSFETs are used in a power management circuit and a safety circuit for a lithium-ion battery. The MOSFETs are designed so as to have at lower driving voltage, lower on-resistance and higher breakdown voltage so that it can be directly driven by battery voltage.

These devices are desired to switch using inductive load in consideration of motor control devices. Avalanche breakdown may occur in the MOSFETs, when a surge voltage generated by an induced electromotive force exceeds the breakdown voltage of the MOSFETs during switch-off. For example, it is known to solve this problem that an active clamp circuit which has a diode connected between a gate and a drain with higher breakdown voltage than that of the MOSFETs. If drain voltage of the MOSFETs increases over breakdown voltage of the diode, the diode is broken down before the avalanche breakdown in the MOSFETs occurs during switch-off. This breakdown increases a gate voltage of the MOSFETs and forms a channel.

DETAILED DESCRIPTION

In general, according to one embodiment, a semiconductor device includes a first semiconductor layer of a first conductivity type, a second semiconductor layer of a second conductivity type, a third semiconductor layer of the first conductivity type, a first insulating film, a second insulating film, a first electrode, a second electrode, a third electrode, a floating electrode.

The first electrode is electrically connected to the first semiconductor layer. The second semiconductor layer is provided on the first semiconductor layer. The third semiconductor layer is selectively provided on the second semiconductor layer. The second electrode is electrically connected to the second semiconductor layer and the third semiconductor layer. The third electrode is provided from an upper surface side of the third semiconductor layer through the third semiconductor layer and the second semiconductor layer to the first semiconductor layer via a first insulating film. The floating electrode is provided from an upper surface side of the third semiconductor layer through the third semiconductor layer and the second semiconductor layer to the first semiconductor layer via a first insulating film. The second insulating film is provided between the second electrode and the third electrode, the second electrode and the floating electrode. A voltage $BV_0$ between the first electrode and the second electrode is lower than an avalanche breakdown voltage $BV_1$ of the semiconductor device without the floating electrode and the voltage $BV_0$ is given by the following formulas:

$$BV_0 = ((C_{fd} + C_{fs})/C_{fd}) \times V_{th},$$

where $C_{fd}$ is a capacitance between the floating electrode and the first electrode, $C_{fs}$ is a capacitance between the floating electrode and the second electrode and $V_{th}$ is threshold voltage of the floating electrode.

Embodiments of the invention will be described with reference to the drawings. Although the embodiments are described assuming that the first conductivity type is N⁻type and the second conductivity type is p⁻type, the embodiments can also be practiced with these types interchanged. In the case, where n⁻type impurity layers are labeled with symbols n and n⁺, it means that the n⁻type impurity concentration in those layers increases in the order of n<n⁺. This also applies to p⁻type impurity layers. Furthermore, unless otherwise specified, the impurity concentration refers to the net impurity concentration after compensation between the conductivity types.

[First Embodiment]

Figure 1:
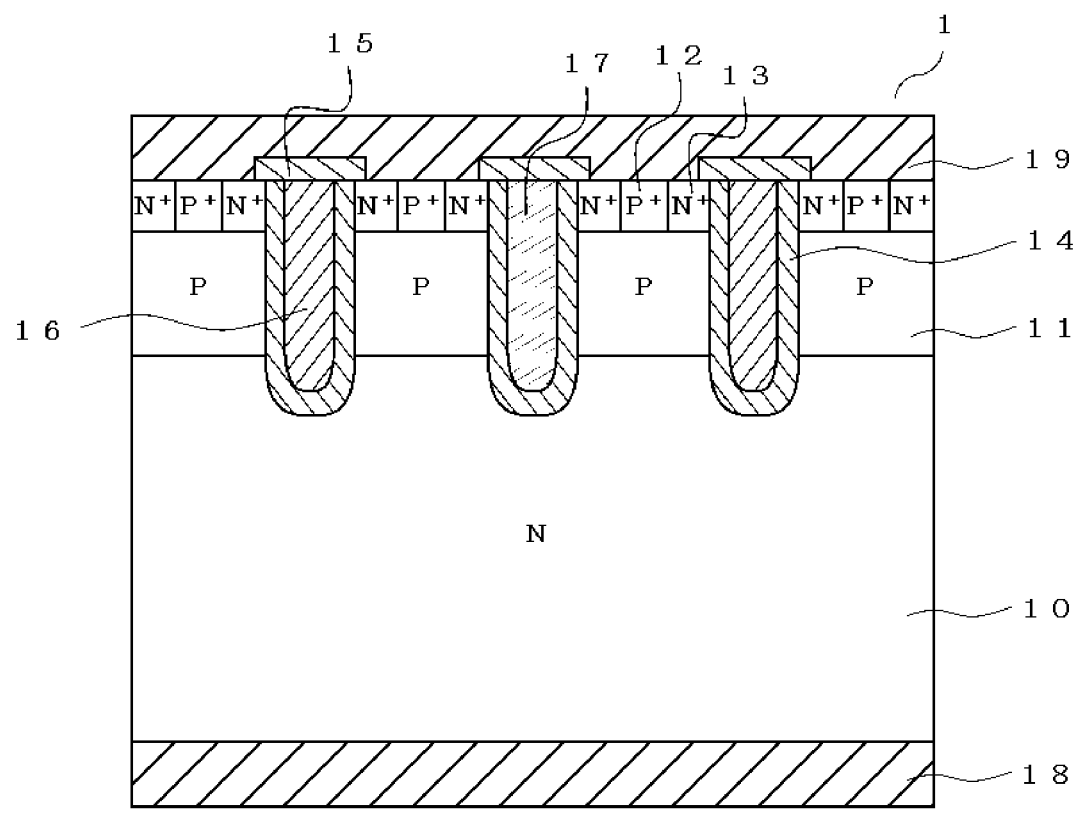
FIG. 1 shows a cross-sectional view of a semiconductor device according to a first embodiment of the invention.

A first embodiment of the invention will be described with reference to FIG. 1. FIG. 1 is a cross-sectional view of a semiconductor device 1 according to the first embodiment of the invention. The semiconductor device 1 is provided with an n⁻type drift layer 10 (a first semiconductor layer), a p⁻type base layer 11 (a second semiconductor layer), a p⁺⁻type contact layer 12 (a fourth semiconductor layer), an n⁺⁻type source layer 13 (a third semiconductor layer), a gate insulating film 14 (a first insulating film), an interlayer insulating film 15 (a second insulating film), a gate electrode 16 (a third electrode), a floating electrode 17, a drain electrode 18 (a first electrode) and a source electrode 19 (a second electrode).

The drain electrode 18 is provided on one surface of the n⁻type drift layer 10. The p⁻type base layer 11 is provided on the other surface of n⁻type drift layer 10. The P⁺⁻type contact layer 12 is provided on the p⁻type base layer 11. The n⁺⁻type source layer 13 is selectively provided on the p⁻type base layer 11 and at each side of the p⁺⁻type contact layer 12. The source electrode 19 is provided on both of the p⁺⁻type contact layer 12 and the n⁺⁻type source layer 13. The n⁻type drift layer 10 may be made of a semiconductor such as silicon (Si), silicon carbide (SiC) and gallium nitride (GaN). The drain electrode 18 and the source electrode 19 may be used such as aluminum.

The gate electrode 16 is provided from an upper surface side of the n⁺⁻type source layer 13 through the n⁺⁻type source layer 13 and the p⁺⁻type contact layer 12 to the n⁻type drift layer 10 via the gate insulating film 14. The floating electrode 17 is provided from an upper surface side of the n⁺⁻type source layer 13 through the n⁺⁻type source layer 13 and the p⁺⁻type contact layer 12 to the n⁻type drift layer 10 via the gate insulating film 14. For example, the gate electrode 16 and the floating electrode 17 are arranged alternately. The gate insulating film 14 may be made of a dielectric such as silicon oxide ($SiO_2$) formed by e.g. CVD (Chemical Vapor Deposition) or thermal oxidation, or may be silicon nitride (SiN), aluminum oxide ($Al_2O_3$), hafnium oxide ($HfO_2$) and zirconium oxide ($ZrO_2$). The gate electrode 16 and the floating electrode 17 may be made of such as p⁻type or n⁻type polycrystalline silicon, or may be other materials with high electric conductivity.

The interlayer insulating film 15 is provided between the source electrode 19 and the gate electrode 16, the source electrode 19 and the floating electrode 17. The interlayer insulating film 15 may be made of a dielectric such as silicon oxide ($SiO_2$), or may be silicon nitride (SiN). The source electrode 19 is provided in contact with the p⁺⁻type contact layer 12, the n⁺⁻type source layer 13 and the interlayer insulating film 15. The source electrode 19 is electrically insulated from the gate electrode 16 and the floating electrode 17 by the interlayer insulating film 15. The source electrode 19 is electrically connected to the n⁺⁻type source layer 13. The source electrode 19 is electrically connected to the p⁻type base layer 11 through the p⁺⁻type contact layer 12 to reduce a contact resistance. The source electrode 19 may be directly connected to the p⁻type base layer 11 without the p⁺⁻type contact layer 12. The source electrode 19 may be made of such as aluminum, or may be other materials with high electric conductivity.

Voltage $V_{fs}$ between the floating electrode 17 and the source electrode 19 is given by the following formula (1):

$$V_{fs}=(C_{fd}/(C_{fd}+C_{fs}))V_{ds} \quad (1),$$

where $C_{fd}$ is the capacitance between the floating electrode 17 and the drain electrode 18, $C_{fs}$ is the capacitance between the floating electrode 17 and the source electrode 19 and $V_{ds}$ is voltage between the drain electrode 18 and the source electrode 19. When threshold voltage $V_{th}$ of the floating electrode 17 is applied on the floating electrode 17, the following relation can be established:

$$V_{fs}=V_{th} \quad (2).$$

Voltage $BV_0$ between the drain electrode 18 and the source electrode 19 is given by the following formula (3).

$$BV_0=(C_{fd}+C_{fs})V_{th}/C_{fd} \quad (3).$$

The material, thickness and shape of each layer are designed so as to satisfy the following formula (4).

$$BV_0<BV_1 \quad (4),$$

wherein $BV_1$ is an avalanche breakdown voltage when the semiconductor device has none of the floating electrode.

Next, an operation of the semiconductor device 1 will be described. A positive voltage relative to the source electrode 19 is applied to the drain electrode 18. Additionally, voltage higher than the threshold voltage is applied to the gate electrode 16. Then, a channel is formed in the p⁻type base layer 11 along the lateral part of the gate insulating film 14 adjacent to the gate electrode 16. Accordingly, the semiconductor device 1 turns on and the electrons flow from the source electrode 19 through the n⁺⁻type source layer 13, the channel in the p⁻type base layer 11 and the n⁻type drift layer 10 to the drain electrode 18. The channel is not formed along the lateral part of the gate insulating film 14 adjacent to the floating electrode 17.

A zero voltage or negative voltage is applied to the gate electrode 16. Then the channel formed along the lateral part of the gate insulating film 14 adjacent to the gate electrode 16 disappears and the electrons do not flow from the source electrode 19 to the drain electrode 18. Accordingly, the semiconductor device 1 turns off. Positive voltage relative to the source electrode 19 remains applied to the drain electrode 18. Therefore, an avalanche breakdown may occur at p⁻n junction boundary between the n³¹ type drift layer 10 and the p⁻type base layer 11, when the semiconductor device has none of the floating electrode.

An effect of the semiconductor device 1 will be described. The voltage $BV_0$ between the drain electrode 18 and the source electrode 19 is given by the formula (3) when the channel is formed in the p⁻type base layer 11 along the lateral part of the gate insulating film 14 adjacent to the floating electrode 17. The semiconductor device 1 is designed so as to satisfy the formula (4), wherein $BV_1$ is the avalanche breakdown voltage when the semiconductor device has none of the floating electrode. The channel is formed along the lateral part of the gate insulating film 14 adjacent to the floating electrode 17 when voltage higher than the threshold voltage of the floating electrode 17 ($V_{th}$) is applied to the floating electrode 17. The electrons flow from the source electrode 19 through the n+-type source layer 13, the channel in the p⁻type base layer 11 and the N⁻type drift layer 10 to the drain electrode 18. The channel is not formed along the lateral part of the gate insulating film 14 adjacent to the gate electrode 16. Hence, the avalanche breakdown can be prevented.

[Second Embodiment]

A second embodiment of the invention will be described with reference to FIG. 2. In the following description, the portions identical or similar to those of the first embodiment are not described and only the portions different from those of the first embodiment are described.

Figure 2:
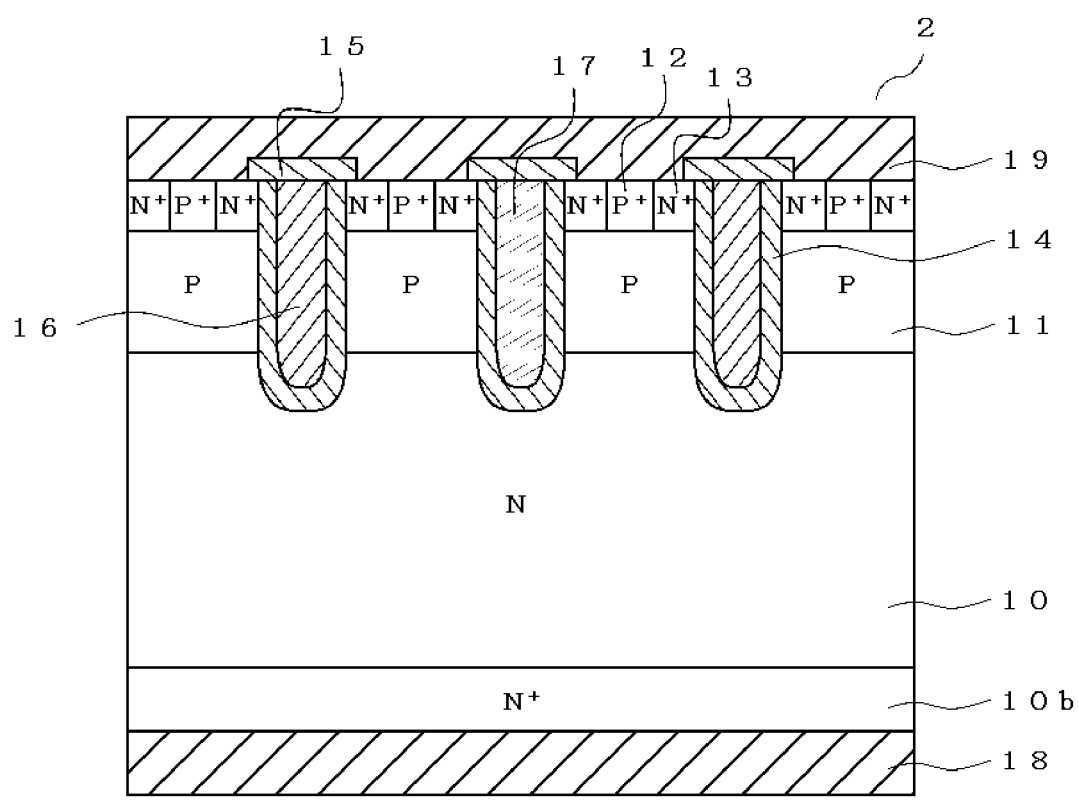
FIG. 2 shows a cross-sectional view of a semiconductor device according to a second embodiment of the invention.

FIG. 2 is a cross-sectional view of a semiconductor device 2 according to the second embodiment of the invention. The semiconductor device 2 of the second embodiment of the invention is different from the semiconductor device 1 of the first embodiment in that a n⁺⁻type drift layer 10b (a fifth semiconductor layer) having a higher n⁻type impurity concentration than the n⁻type drift layer 10 is provided between the n⁻type drift layer 10 and the drain electrode 18. The n⁺⁻type drift layer 10b may be made of a semiconductor such as silicon (Si), silicon carbide (SiC) and gallium nitride (GaN). The others are similar to the semiconductor device 1 of the first embodiment of the invention.

The operation of the semiconductor device 2 will be described. The operation of the semiconductor device 2 of the second embodiment is similar to that of the semiconductor device 1 of the first embodiment.

The effect of the semiconductor device 2 will be described. The on-resistance can be reduced by replace a part of the n⁻type drift layer 10 with the n⁺⁻type drift layer 10b having a higher n⁻type impurity concentration. Depletion layer is formed in near the junction between the n⁻type drift layer 10 and the p⁻type base layer 11 when positive voltage relative to the source electrode 19 is applied to the drain electrode 18. The n⁻type impurity concentration in the n⁻type drift layer 10 of the semiconductor device 2 is similar to that of the semiconductor device 1. The n⁺⁻type drift layer 10b has no impact on the depletion layer. Consequently, the on-resistance can be reduced while maintaining the high breakdown voltage of the semiconductor device.

[Third Embodiment]

A third embodiment of the invention will be described with reference to FIG. 3. In the following description, the portions identical or similar to those of the first embodiment are not described and only the portions different from those of the first embodiment are described.

Figure 3:
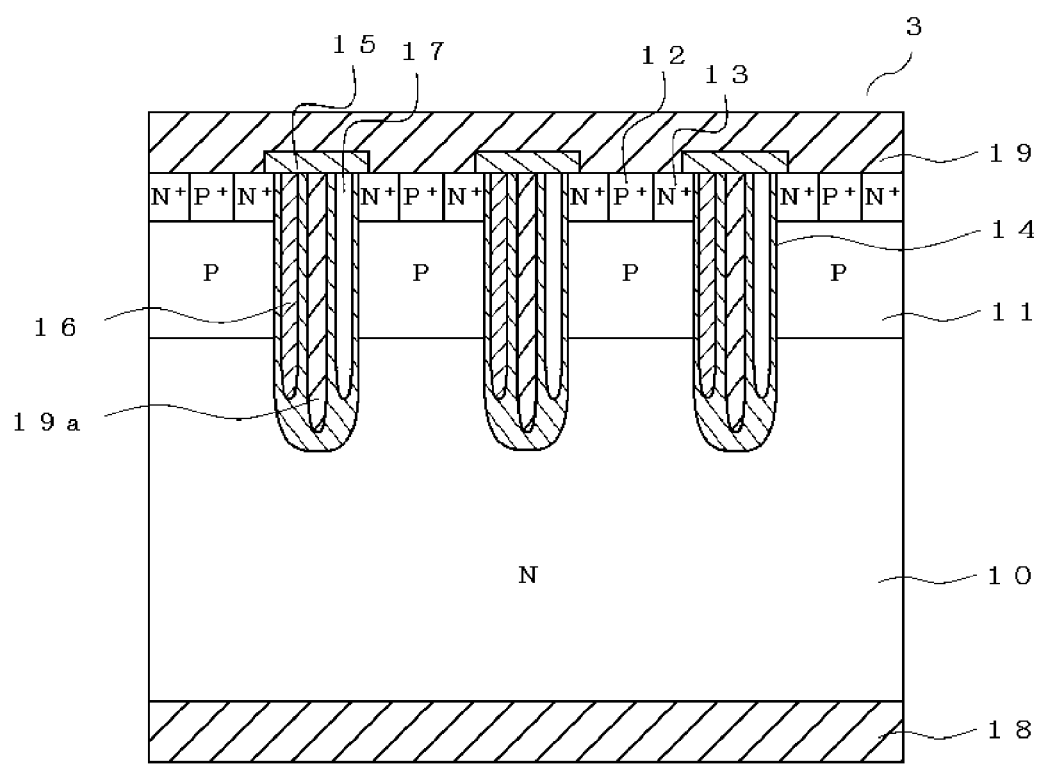
FIG. 3 shows a cross-sectional view of a semiconductor device according to a third embodiment of the invention.

FIG. 3 is a cross-sectional view of a semiconductor device 3 according to the third embodiment of the invention. The semiconductor device 3 of the third embodiment of the invention is different from the semiconductor device 1 of the first embodiment in that a source electrode 19a is provided from an upper surface side of the n$^+$-type source layer 13 through the n$^+$-type source layer 13 and the p$^+$-type contact layer 12 to the n$^-$type drift layer 10 via the gate insulating film 14. The gate electrode 16, the floating electrode 17 and the source electrode 19a are insulated from each other by the gate insulating film 14. The source electrode 19a is electrically connected to the source electrode 19. The gate electrode 16, the floating electrode 17 and the source electrode 19a may be made of such as p$^-$type or n$^-$type polycrystalline silicon, or may be other materials with high electric conductivity. The others are similar to the semiconductor device 1 of the first embodiment of the invention.

The operation of the semiconductor device 3 will be described. The channel is formed in the p$^-$type base layer 11 along the lateral part of the gate insulating film 14 adjacent to the gate electrode 16 for on$^-$state. The electrons flow from the source electrode 19 through the n$^+$-type source layer 13, the channel inversion layer in the p$^-$type base layer 11 and the n$^-$type drift layer 10 to the drain electrode 18. The channel is not formed along the lateral part of the gate insulating film 14 adjacent to the floating electrode 17 for on$^-$state. The channel is not formed along the lateral part of the gate insulating film 14 adjacent to the gate electrode 16 and the floating electrode 17 for off-state. The electrons do not flow from the source electrode 19 to the drain electrode 18.

The depletion layer is extended to the n$^-$type drift layer 10 from the junction between the n$^-$type drift layer 10 and the p$^-$type base layer 11 when positive voltage relative to the source electrode 19 is applied to the drain electrode 18. At once, positive voltage relative to the source electrode 19a is applied to the drain electrode 18. The n$^-$type drift layer 10 and the drain electrode 18 are equipotential. Thus, the electrons are excluded near the source electrode 19a and the region near the source electrode 19a is depleted. The depletion layer is extended to the n$^-$type drift layer 10 from the junction between the n$^-$type drift layer 10 and the gate insulating film 14. This means that the depletion layer expands into the n$^-$type drift layer 10 from the p$^-$type base layer 11 and the source electrode 19a on either side of the n$^-$type drift layer 10.

Consequently, the depletion layer is generated in the n$^-$type drift layer 10 from three directions and the breakdown voltage of the semiconductor device 3 can be increased by the source electrode 19a. As described above, the semiconductor device 3 is operated to switch between on and off states by the control of the gate electrode 16.

The effect of the semiconductor device 3 will be described. The effect of the semiconductor device 3 is similar to that of the semiconductor device 1. The semiconductor device 1 is designed so as to satisfy the formula (4), wherein $BV_0$ is the voltage between the drain electrode 18 and the source electrode 19 and $BV_1$ is the avalanche breakdown voltage when the semiconductor device has none of the floating electrode. The channel is formed along the lateral part of the gate insulating film 14 adjacent to the floating electrode 17 when voltage higher than the threshold voltage of the floating electrode 17 ($V_{th}$) is applied to the floating electrode 17. The electrons flow from the source electrode 19 to the drain electrode 18. The channel is not formed along the lateral part of the gate insulating film 14 adjacent to the gate electrode 16. Hence, the avalanche breakdown can be prevented.

In addition, the semiconductor device 3 has the source electrode 19a. The depletion layer is extended to the n$^-$type drift layer 10 from the junction between the n$^-$type drift layer 10 and the p$^-$type base layer 11 when positive voltage relative to the source electrode 19 is applied to the drain electrode 18. Positive voltage relative to the source electrode 19a is applied to the drain electrode 18. The n$^-$type drift layer 10 and the drain electrode 18 are equipotential. The electrons are excluded near the source electrode 19a and the region near the source electrode 19a is depleted. The depletion layer is extended to the n$^-$type drift layer 10 from the junction between the n$^-$type drift layer 10 and the gate insulating film 14. This means that the depletion layer expands into the n$^-$type drift layer 10 from the p$^-$type base layer 11 and the source electrode 19a on either side of the n$^-$type drift layer 10.

Consequently, the depletion layer is generated in the n$^-$type drift layer 10 from three directions and the breakdown voltage of the semiconductor device 3 can be increased by the source electrode 19a.

[Forth Embodiment]

A forth embodiment of the invention will be described with reference to FIG. 4. In the following description, the portions identical or similar to those of the above third embodiment are not described and only the portions different from those of the third embodiment are described.

Figure 4:
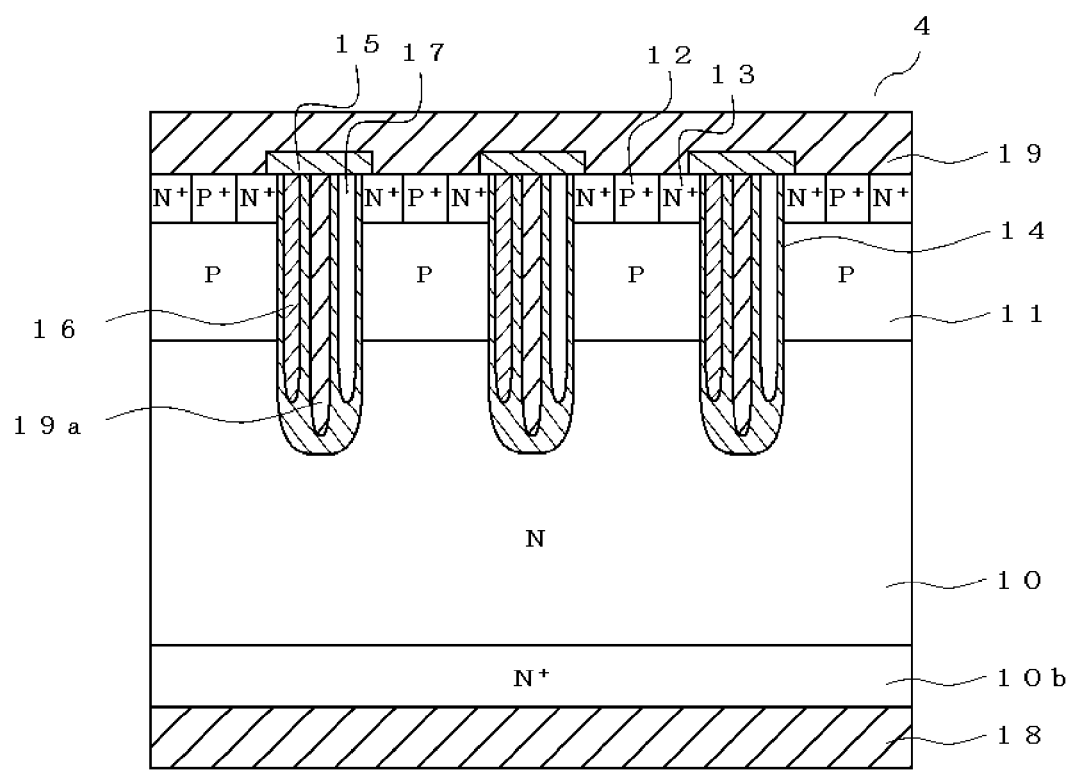
FIG. 4 shows a cross-sectional view of a semiconductor device according to a fourth embodiment of the invention.

FIG. 4 is a cross-sectional view of a semiconductor device 4 according to the forth embodiment of the invention. The semiconductor device 4 of the forth embodiment of the invention is different from the semiconductor device 3 of the third embodiment in that a n$^+$-type drift layer 10b (a fifth semiconductor layer) having a higher n$^-$type impurity concentration than the n$^-$type drift layer 10 is formed between the n$^-$type drift layer 10 and the drain electrode 18. The n$^+$-type drift layer 10b may be made of a semiconductor such as silicon (Si), silicon carbide (SiC) and gallium nitride (GaN). The others are similar to the power semiconductor device 3 of the third embodiment of the invention.

The operation of the semiconductor device 4 will be described. The operation of the semiconductor device 4 is similar to that of the semiconductor device 3.

The effect of the semiconductor device 4 will be described. The on-resistance can be reduced by replace a part of the n$^-$type drift layer 10 with the n$^+$-type drift layer 10b having a higher n$^-$type impurity concentration. The depletion layer is generated in the ntype drift layer 10 from the p$^-$type base layer 11 and the source electrode 19a on either side of the n$^-$type drift layer 10 when positive voltage relative to the source electrode 19 is applied to the drain electrode 18 and when positive voltage relative to the source electrode 19a is applied to the drain electrode 18.

The n$^-$type impurity concentration in the n$^-$type drift layer 10 of the semiconductor device 4 is similar to that of the semiconductor device 3. The n$^+$-type drift layer 10b has no impact on the depletion layer. Consequently, the on-resistance can be reduced while maintaining the high breakdown voltage of the semiconductor device.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a first semiconductor layer of a first conductivity type;
a first electrode electrically connected to the first semiconductor layer;
a second semiconductor layer of a second conductivity type provided on the first semiconductor layer;
a third semiconductor layer of the first conductivity type selectively provided on the second semiconductor layer;
a second electrode electrically connected to the second semiconductor layer and the third semiconductor layer;
a third electrode provided from an upper surface side of the third semiconductor layer through the third semiconductor layer and the second semiconductor layer to the first semiconductor layer via a first insulating film;
a floating electrode provided from an upper surface side of the third semiconductor layer through the third semiconductor layer and the second semiconductor layer to the first semiconductor layer via a first insulating film; and
a second insulating film provided between the second electrode and the third electrode, the second electrode and the floating electrode,
a voltage $BV_0$ between the first electrode and the second electrode is lower than an avalanche breakdown voltage $BV_1$ of the semiconductor device without the floating electrode and the voltage $BV_0$ is given by the following formulas:

$$BV_0 = ((C_{fd} + C_{fs})/C_{fd}) \times V_{th},$$

where $C_{fd}$ is a capacitance between the floating electrode and the first electrode, $C_{fs}$ is a capacitance between the floating electrode and the second electrode and $V_{th}$ is threshold voltage of the floating electrode.

2. The semiconductor device according to claim 1, wherein a fifth semiconductor layer is provided between the first semiconductor layer and the first electrode; and an n⁻type impurity concentration of the fifth semiconductor layer is higher than the first semiconductor layer.

3. A semiconductor device comprising:
a first semiconductor layer of a first conductivity type;
a first electrode electrically connected to the first semiconductor layer;
a second semiconductor layer of a second conductivity type provided on the first semiconductor layer;
a third semiconductor layer of the first conductivity type selectively provided on the second semiconductor layer;
a second electrode electrically connected to the second semiconductor layer and the third semiconductor layer and provided from an upper surface side of the third semiconductor layer through the third semiconductor layer and the second semiconductor layer to the first semiconductor layer via a first insulating film;
a third electrode provided from an upper surface side of the third semiconductor layer through the third semiconductor layer and the second semiconductor layer to the first semiconductor layer via a first insulating film;
a floating electrode provided from an upper surface side of the third semiconductor layer through the third semiconductor layer and the second semiconductor layer to the first semiconductor layer via a first insulating film; and
a second insulating film provided between the second electrode and the third electrode, the second electrode and the floating electrode,
a voltage $BV_0$ between the first electrode and the second electrode is lower than an avalanche breakdown voltage $BV_1$ of the semiconductor device without the floating electrode and the voltage $BV_0$ is given by the following formulas:

$$BV_0 = ((C_{fd} + C_{fs})/C_{fd}) \times V_{th},$$

where $C_{fd}$ is a capacitance between the floating electrode and the first electrode, $C_{fs}$ is a capacitance between the floating electrode and the second electrode and $V_{th}$ is threshold voltage of the floating electrode.

4. The semiconductor device according to claim 3, wherein a fifth semiconductor layer is provided between the first semiconductor layer and the first electrode; and an n⁻type impurity concentration of the fifth semiconductor layer is higher than the first semiconductor layer.

* * * * *